United States Patent
Klee et al.

(10) Patent No.: US 6,528,863 B1
(45) Date of Patent: Mar. 4, 2003

(54) PEROVSKITE-CONTAINING COMPOSITE MATERIAL, METHOD OF MANUFACTURING SAID MATERIAL, ELECTRONIC COMPONENT AND MODULE

(75) Inventors: Mareike K. Klee, Hückelhoven (DE); Hans-Wolfgang Brand, Aachen (DE); Poul Larsen, Geldrop (NL)

(73) Assignees: Koninklijke Philips Electronics N.V., Eindhoven (NL); U.S. Philips Corporation, New York, NY (US)

( * ) Notice: Subject to any disclaimer, the term of this patent is extended or adjusted under 35 U.S.C. 154(b) by 0 days.

(21) Appl. No.: 08/408,753

(22) Filed: Mar. 22, 1995

(30) Foreign Application Priority Data

Mar. 22, 1994 (DE) .......................................... 44 09 697

(51) Int. Cl.[7] .............................................. H01L 29/93
(52) U.S. Cl. ...................... 257/595; 428/446; 428/697; 428/699; 428/701; 428/702; 427/226; 427/126.3
(58) Field of Search ................................ 423/593, 598; 502/525; 427/226, 126.3; 428/697, 699, 701, 702, 446; 257/595

(56) References Cited

U.S. PATENT DOCUMENTS

| 5,198,269 A | | 3/1993 | Swartz et al. ................ 427/226 |
| 5,504,330 A | * | 4/1996 | Summerfelt et al. ..... 250/338.3 |

* cited by examiner

*Primary Examiner*—Tom Dunn
*Assistant Examiner*—Christina Ildebrando
(74) *Attorney, Agent, or Firm*—Ernestine C. Bartlett

(57) ABSTRACT

A perovskite-containing composite material comprising a substrate, an intermediate layer of a first titanium-containing perovskite and a covering layer of a second perovskite, both the first and the second perovskites being quaternary or higher-substituted perovskites. This composite material exhibits a single-phase perovskite covering layer and, consequently, can very suitably be used for the manufacture of electronic components and modules comprising integrated passive components. A description is given of a method of manufacturing said composite material.

20 Claims, No Drawings

PEROVSKITE-CONTAINING COMPOSITE MATERIAL, METHOD OF MANUFACTURING SAID MATERIAL, ELECTRONIC COMPONENT AND MODULE

BACKGROUND OF THE INVENTION

The invention relates to a perovskite-containing composite material comprising a substrate, an intermediate layer of a first, titanium-containing perovskite and a covering layer of a second perovskite. The invention also relates to a method of manufacturing this perovskite-containing composite material, an electronic component comprising this composite material and a module having integrated passive components.

Such a perovskite-containing composite material is important for a large number of novel applications in microelectronics.

Ceramic perovskites are used in a wide range of applications in the semiconductor industry, because they offer interesting properties for special technical applications, such as for ferroelectric, dielectric, pyroelectric, piezoelectric or optoelectronic components.

For example, lead-zirconium-titanium-perovskites (PZT) are used, inter alia, for non-volatile, ferroelectric memories. Lanthanum-doped PZTs (PLZT) and complex titanium-containing perovskites, such as $Pb(Mg, Nb)_x Ti_{1-x} O_3$ are used as dielectric materials in capacitors, and PLZTs are also used as optoelectronic materials.

In combination with the known substrates, some perovskite composite materials have gained particular importance for the construction of modules comprising integrated passive components. To this end, passive components, such as capacitors, resistors and coils are integrated in electronic circuits by depositing said components on a silicon or aluminium-oxide substrate by means of thin-film techniques. Another important application of these composite materials is formed by capacitors for ferroelectric, non-volatile memories and random-access write-read memories.

In order to obtain perovskites having satisfactory properties (density, crystallinity), said perovskites must be sintered at high temperatures, however, as most of the substrates used in microelectronics cannot withstand said temperatures, jointly sintering the perovskites and said substrates is hampered.

Therefore, it is necessary to manufacture perovskite-containing composite materials which exhibit suitable properties when sintered at a temperature which does not adversely affect the substrate.

With regard to this, a method of manufacturing a thin film from a ferroelectric perovskite material is described, for example, in U.S. Pat. No. 5,198,269, the contents of which are hereby incorporated by reference; said method comprising the following steps:

a. providing a first substrate,
b. selecting a first sol-gel-perovskite precursor material, the crystallization of this first sol-gel-perovskite precursor material to the perovskite phase being insensitive to the first substrate and, after the heat treatment, the material being isostructural relative to the second ferroelectric, perovskite thin-film material,
c. depositing a first layer of the selected sol-gel-perovskite precursor material,
d. subjecting said first layer to a thermal treatment to form a first ferroelectric, perovskite thin-film material,
e. selecting a second sol-gel-perovskite precursor material, the crystallization of this second sol-gel-perovskite precursor material to the perovskite phase being sensitive to the substrate,
f. depositing a second layer of the selected sol-gel-perovskite starting material,
g. subjecting said second layer to a thermal treatment to form a second ferroelectric, perovskite thin-film material, the second layer of the second sol-gel-perovskite precursor material, after heat treatment, having better perovskite crystallinity when deposited on the first layer than if it would have been deposited directly on the substrate and heat treated.

The first sol-gel-perovskite starting material is selected to form, as a perovskite in step d., lead titanate ($PbTiO_3$) or strontium titanate ($SrTiO_3$).

The perovskite-containing composite materials manufactured in accordance with this method exhibit good crystallinity in the second perovskite layer. However, this second perovskite layer often comprises secondary crystalline phases (cf. U.S. Pat. No. 5,198,269 A, column 19, lines 2–5) which adversely affect the properties of the layer.

SUMMARY OF THE INVENTION

Therefore, it is an object of the invention to provide a perovskite-containing composite material which comprises a substrate, an intermediate layer of a first, titanium-containing perovskite and a covering layer of a second perovskite, and which exhibits improved properties.

According to the invention, this object is achieved by a perovskite-containing composite material in which both the first and the second perovskites are quaternary, or higher, complex perovskites.

In this composite material in accordance with the invention, the quaternary, titanium-containing perovskite of the intermediate layer acts as the nucleating layer for the formation of perovskite in the covering layer. Since this nucleating layer and the perovskites of the covering layer have a similar lattice constant and crystallographic space group, said nucleating layer enables single-phase perovskite to be formed in the covering layer during sintering and a reduction of the sintering temperature. Disturbing secondary phases, such as pyrochlore phases or the like, or amorphous phases do not occur in the covering layer. Such composite materials comprising a single-phase perovskite coating have an optimum texture and exhibit excellent characteristics, for example, for ferroelectric, non-volatile memories because they have a very high switched polarization. Such composite materials can also very suitably be used for capacitor applications because they have a remarkably high relative dielectric constant and hence a high surface capacitance.

A further advantage of the inventive composite material comprising a homogeneous, single-phase covering layer is that the covering layer can be structured so as to be clean-cut with sharp contours by means of known etch techniques. Composite materials having secondary phases in the perovskite-containing covering layer, however, form residues which are difficult to remove in these processes.

Within the scope of the invention it is preferred that both the first and the second perovskites contain titanium and that the titanium content of the first perovskite is higher than that of the second perovskite. The formation of the nucleating layer and the covering layer enables very good crystalline covering layers to be achieved.

Within the scope of the invention it is further preferred that the perovskite of the covering layer contains lead because, owing to the ferroelectric properties of the covering layer, such composite materials can very suitably be used, in particular, for a large number of microelectronic applications.

For several applications it is preferred that also the perovskite of the intermediate layer contains lead, so that its lattice symmetry corresponds to that of the perovskite of the coating.

Inventive composite materials whose perovskite of the covering layer is $PbZr_xTi_{1-x}O_3$, wherein $0.53 \leq x < 1$, can particularly suitably be used for non-volatile, ferroelectric memories and for piezoelectric applications.

Inventive composite materials whose perovskite of the covering layer is $(Pb_{1-1.5y}La_y)Zr_xTi_{1-x}O_3$, wherein $0.01 \leq y \leq 0.15$ and $0.53 \leq x < 1$ or $Pb(Mg, Nb)_xTi_{1-x}O_3$, wherein $0.65 \leq x \leq 0.9$ can very suitably be used to manufacture integrated capacitors and capacitors for dynamic, random-access write-read memories. Since the perovskite phase is free of pyrochlore, these capacitors have a high relative dielectric constant and a high surface capacitance.

In accordance with an advantageous embodiment of the invention, the perovskite of the intermediate layer is $PbZr_xTi_{1-x}O_3$, wherein $0 < x \leq 0.35$.

If this perovskite is used as the intermediate layer, crystallization of the perovskite in the covering layer starts at very low temperatures.

In accordance with the invention, the substrate preferably comprises a layer of silicon monocrystal. This combination of materials in the composite material is particularly suitable for ferroelectric non-volatile memories, dynamic random-access write-read memories and integrated capacitors.

The invention further relates to a method of manufacturing the inventive, perovskite-containing composite material by coating a substrate with a first titanium-containing, quaternary or higher-substituted perovskite as the intermediate layer and with a second quaternary or higher-substituted perovskite as the covering layer, the coating of the intermediate layer being sintered before the covering layer is provided.

The invention further aims at providing an electronic component of an inventive composite material. The inventive composite material can very advantageously be used in a ferroelectric, non-volatile memory because the single-phase perovskites exhibit a very high degree of polarization. These single-phase perovskites also lead to improved properties of integrated capacitors, actuators, sensors and optoelectronic components.

The invention finally relates to a so-called "module with integrated passive components" comprising an integrated electronic component in accordance with the invention. An electronic component comprising the composite material in accordance with the invention can particularly suitably be used for modules having integrated passive components because said electronic component can be sintered at low temperatures and etched in a very clean-cut manner.

DETAILED DESCRIPTION OF THE INVENTION

The invention will be explained in greater detail by means of exemplary embodiments.

The composite material in accordance with the invention may be, for example, a particle composite, fibre composite, infiltration composite or, in particular, a composite in the form of (a) layer(s). Consequently, the substrate can consist of particles, fibres, such as glass fibres, a porous body or a disc, such as a silicon monocrystal disc.

In microelectronics the term "substrate" is to be understood to mean in general a disc of a material, such as silicon monocrystal, aluminium-oxide ceramic, sapphire or gallium arsenide. In optoelectronics, the substrate may also consist of glass.

Within the scope of the invention, the term "substrate" should be understood to include also a substrate which consists of a plurality of layers. For example, silicon-monocrystal substrates may already have been provided with a protective coating of $SiO_2$, an adhesive layer of titanium or an electrode layer of metal of the platinum group.

In accordance with the invention, such a substrate is provided with an intermediate layer of a titanium-containing, quaternary or higher-substituted perovskite and, subsequently, with a covering layer of a quaternary or higher-substituted perovskite.

The simplest perovskites are ternary oxides of the general composition $ABO_3$. Variants of the compounds having the perovskite structure are formed in that the A and/or B cations can be partly substituted by one or more other cations, so that the initially ternary perovskites $ABO_3$ are changed into higher-multiple perovskites, for example quaternary, quinary, senary, septenary, etc., perovskites.

As regards substitution, the perovskite structure is very adaptable, i.e. at the lattice sites of the A cations it can simultaneously comprise up to 20 different cations, and at the lattice sites of the B cations it can simultaneously comprise up to 40 different cations. A survey of the multitude of substituted perovskites and their applications is given in R M. Hazen "Perowskite", Spektrum der Wissenschaften, August 1988, pp. 42–50. A further survey of perovskite materials is given in "Process mineralogy of ceramic materials" edited by W. Baumgart et. al., Stuttgart: Enke (1984), p. 115 ff.

In accordance with the invention, quaternary or higher-substituted perovskites are used which are selected because of their dielectric, ferroelectric, piezoelectric, pyroelectric or birefringent properties.

A large group of the substituted perovskites on the basis of $BaTiO_3$ can for example be used as filters, capacitors, non-linear resistors, and the like.

Materials which are commercially very important are the PZTs, i.e. lead-zirconium-titanate $Pb(Ti,Zr)O_3$ which are used as piezoceramic materials in actuators or, for example, as ferroelectric materials in memories. Lanthanum-doped PZTs (LPZT) are transparent and exhibit a linear or quadratic electrooptic effect. For this reason, they are also used for optoelectronic purposes.

The intermediate layer and the covering layer can be provided by means of dry or wet-chemical deposition.

The dry deposition processes include cathode sputtering, in which the required energy is provided by radio frequency or an ion beam. The dry deposition process further includes thermal and electron-beam evaporation, metallo- organic CVD (MOCVD) and laser ablation.

The wet-chemical deposition processes also enable critical parameters, such as the chemical composition, stoichiometry, purity and homogeneity of the thin-film ceramic material and of the intermediate layer and the covering layer to be controlled in a reproducible manner. This method includes the sol-gel method and metallo-organic decomposition (MOD), cf J. Appl. Phys. 72 (4), 1566 (1992).

In these wet-chemical methods use is predominantly made of metal alcoholates as the chemical precursor compounds. In a poly-condensation process, the sol-gel solution is formed from said starting compounds. The MOD process uses compounds of a higher molecular weight, for example octanoates or decanoates, which react insensitively to the hydrolysis reaction but, under specific conditions, are more difficult to hydrolyse when the layers are subjected to a burn-out process.

To compensate for the loss of lead during the firing process and to promote crystallization of the perovskites, the mixture of the starting compounds may comprise an excess of lead of preferably 5 to 20 wt. % Pb. These solutions are applied to the substrate by means of conventional processes, such as spinning, immersing or spraying. In every deposition step, layers of approximately 0.05 $\mu$m to 0.2 $\mu$m are formed. Consequently, the formation of thicker covering layers requires this process to be repeated a number of times.

At first, the layers deposited are amorphous; to form the perovskites a temperature treatment is required which, dependent upon the type of perovskites, is carried out at temperatures ranging between 600° C. and 800° C. On the other hand, however, the temperature treatment has a negative effect on the properties of the substrate, so that said temperature treatment should be carried out at the lowest possible temperatures. Thus, the furnace-temperature curves must be optimized for each application. The formation of perovskites is radiographically examined.

The composite material thus obtained can then be subjected to further processing to obtain electronic components, such as capacitors, in particular integrated capacitors and capacitors for dynamic random-access write-read memories, ferroelectric nonvolatile memories, actuators, resistors, piezoelectric transducers, pyroelectric or piezoelectric sensors or optoelectronic components.

A very important field of application of the inventive composite material is formed by integrated components in which it is used as a ferroelectric memory capacitor or as capacitors integrated in semiconductor ICs, as a capacitor in "modules having integrated passive components", as capacitors for dynamic random-acess write-read memories, as integrated actuators, for example, in micromotors, as integrated pyroelectric or piezoelectric sensors and in similar components. To this end, the composite material must be partially integrated with the silicon or gallium-arsenide technology. Integrated components can be formed in a very wide variety of designs. In general, this requires, apart from the conventional process steps, a number of lithographic steps in which a lower electrode, an upper electrode and an insulating layer are formed. These layers are subsequently structured, for example by argon-ion etching or plasma etching.

Since the inventive composite material comprises single-phase perovskites without the slightest quantity of a second phase, said composite material can be structured without leaving any etch residues. By virtue thereof, for example, integrated passive components comprising active components can be mounted much more easily on the module.

EXAMPLE 1

The laminated composite material in accordance with the invention is manufactured by first providing the intermediate layer on a substrate. To this end, a solution comprising the starting compounds used to form the perovskite $PbZr_{0.35}Ti_{0.65}O_3$ for the intermediate layer is manufactured, in that 17.97 g lead-acetate-trihydrate (58.8 wt. % Pb) are dissolved in 60 g methoxyethanol and 9.34 g titanium tetra-n-butylate (14.1 wt. % Ti) and 6.57 g zirconium tetra-(n)-butylate (20.53 wt. % Zr) are added to this solution. The solution thus formed comprises an excess of lead. This solution in methoxyethanol is homogeneously mixed. After 24 hours the solution is passed through a Teflon filter having a pore size of 0.2 $\mu$m. This solution is applied to a substrate having a layered structure comprising a (100)-monocrystal disc of silicon, 500 nm $SiO_2$, a titanium layer having a thickness of 7 nm and a platinum layer having a thickness of 70 nm. The substrate is spin coated at 2500 r.p.m. The substrate thus coated is heated in a diffusion furnace at a rate of approximately 400° C./min, maintained at 600° C. for 1 h and, subsequently, cooled at a rate of approximately 400° C./min.

The intermediate layer thus obtained has a layer thickness of approximately 0.1 $\mu$m.

EXAMPLE 2

To deposit a single-phase perovskite layer comprising a perovskite of the composition $PbZr_{0.53}Ti_{0.47}O_3$ on a substrate comprising an intermediate layer in accordance with example 1, a solution of the starting compounds is prepared in the following manner: a quantity of 9.41 g lead acetate (63.9 wt. % Pb) were dissolved in 13 ml methoxyethanol. A quantity of 4.22 g titanium tetra-n-butylate (14.1 wt. % Ti) and 6.57 g of zirconium tetra-n-butylate (20.53 wt. % Zr) were dissolved in 3 ml methoxyethanol. The solution containing titanium and zirconium was added to the lead-acetate solution while stirring. Consequently, the solution comprises an excess of lead. Further, a hydrolysing solution comprising 0.71 ml distilled water, 0.37 ml of concentrated $HNO_3$ and 26.4 ml methoxyethanol was manufactured. This hydrolysing solution was added to the solution containing lead, titanium and zirconium. The solution thus pre-hydrolysed was passed through a Teflon filter having a pore size of 0.2 $\mu$m. This solution was provided on the substrate comprising a 0.1 $\mu$m thick intermediate layer of $PbZr_{0.35}Ti_{0.65}O_3$, which substrate was pre-treated in accordance with example 1. Said solution was homogeneously distributed over the pre-treated substrate by means of spin-coating at 2500 r.p.m. This covering layer was also fired at 600° C. in an oxygen atmosphere for one hour. Dependent upon the desired thickness of the covering layer, this coating process can be repeated. In the last coating process, the layer is subjected to a prefiring treatment at 600° C. for one hour, whereafter it is heated at a rate of 5° C./min to 650° C. and subjected to a final treatment at 650° C. for one hour.

EXAMPLE 3

A Si (100)-substrate having a layered structure comprising 500 nm $SiO_2$, 10 nm Ti and 140 nm Pt was provided with an intermediate layer, as described in example 1. A covering layer of single-phase $Pb(Mg_{0.33}Nb_{0.67})_{0.65}Ti_{0.35}O_3$ was deposited thereon in a sol-gel process. To obtain the coating solution, 1.822 g magnesium ethoxide (21.46 wt. % Mg), 10.24 g niobium ethoxide (29.64 wt. % Nb) and 7.46 g titanium isopropoxide (16.86 wt. % Ti) were dissolved in 104 g ethylene glycol monomethylether and refluxed for 24 hours. Further, 56.93 g lead acetate (63.85 wt. % Pb) were dissolved in 185 g ethylene glycol monomethylether. A quantity of 61.12 g of the Mg—Nb—Ti solution were admixed with 56.26 g of the lead-acetate solution and refluxed for 20 hours. Next, the solution was passed through a Teflon filter having a pore size of 0.2 $\mu$m, and the filtrate was applied to the prepared substrate by spin coating at 2500 r.p.m. This coating was sintered for one minute at 800° C. The coating process was repeated 6 times. This method enables a single-phase Pb(Mg$_{0.33}$Nb$_{0.67}$)$_{0.65}$Ti$_{0.35}$O$_3$ layer to be formed on an Si-substrate of the type described hereinabove.

EXAMPLE 4

A Si (100)-substrate having a layered structure consisting of 500 nm SiO$_2$, 10 nm Ti and 140 nm Pt was provided with an intermediate layer as described in example 1. A covering layer of single-phase Pb$_{0.82}$La$_{0.12}$Zr$_{0.7}$Ti$_{0.3}$O$_3$ was deposited thereon in a sol-gel process. To obtain the coating solution, 7.14 g lead acetate (63.85 wt. % Pb) was dissolved in 30 ml methoxyethanol. A quantity of 7.713 g zirconium-n-propoxide (20.68 wt. % Zr) was dissolved in 5 ml methoxyethanol. A quantity of 2.130 g titanium isopropoxide (16.85 wt. % Ti) and 1.28 g lanthanum acetate hydrate (32.3 wt. % La) were added to this solution. This Ti—Zr—La solution was admixed with the Pb solution and, subsequently, diluted with methoxyethanol in a ratio of 1:1. This solution, which comprises an excess of lead, was passed through a Teflon filter having a pore size of 0.2 μm. The filtrate was homogeneously distributed over the prepared substrate by spin-coating at 2500 r.p.m. This coating was heated in a diffusion furnace in an oxygen atmosphere to 700° C. at a rate of approximately 400° C./min, at which temperature of 700° C. it was maintained for 40 minutes, whereafter it was cooled at a rate of 400° C./min. Dependent upon the desired layer thickness, this coating step can be repeated. After the last coating has been provided, the coating is subjected to a final treatment in which it is heated to 700° C. at a rate of 400° C./min, at which temperature it is maintained for 40 minutes, whereafter it is heated to 750° C. at a rate of 5° C./min and maintained at said temperature for one hour, after which it is cooled in the furnace.

EXAMPLE 5

A single-phase perovskite layer comprising a perovskite of the composition PbZr$_{0.48}$Ti$_{0.52}$O$_r$, is deposited on a substrate comprising an intermediate layer of the composition PbZr$_{0.35}$Ti$_{0.65}$O$_3$. The 0.1 μm thick intermediate layer of the composition PbZr$_{0.35}$Ti$_{0.65}$O$_3$ was manufactured in the following manner. The solution described in example 1 is deposited by spin coating at 2500 r.p.m. To form PbZr$_{0.35}$Ti$_{0.65}$O$_3$, the coated substrate is heated in a diffusion furnace at a rate of approximately 350° C./min, maintained at 550° C. for 1 hour and, subsequently, cooled at a rate of 350° C./min. To deposit a perovskite layer of the composition PbZr$_{0.48}$Ti$_{0.52}$O$_3$, this pre-treated substrate is provided with a solution which is manufactured in the following manner: a quantity of 8.560 g lead acetate (63.9 g wt. % Pb) was dissolved in 13.1 ml methoxyethanol. A quantity of 4.204 g titanium tetra-n-butylate (14.1 wt. % Ti) and 5.076 g zirconium-tetra-n-butylate (20.53 wt. % Ti) were dissolved in 3 ml methoxyethanol. The solution comprising titanium and zirconium was admixed with the lead-acetate solution. Further, a hydrolysing solution of 0.64 ml distilled water, 0.33 ml concentrated HNO$_3$ and 26.4 ml methoxyethanol was prepared. This hydrolysing solution was added to the solution comprising lead, titanium and zirconium. The solution thus pre-hydrolysed was passed through a Teflon filter having a pore size of 0.2 μm. This solution, which comprises an excess of lead, was then homogeneously distributed over the above-described, pre-treated substrate by spin coating at 2500 r.p.m. This covering layer was prefired at 550° C. for one hour. Dependent upon the desired thickness of the covering layer, this coating process can be repeated. In the last coating process, the coating is pre-fired at 600° C., whereafter it is heated to 650° C. at a rate of 5° C./min and treated at this temperature for 5 minutes.

This composite material can very suitably be used for pyroelectric applications.

EXAMPLE 6

To deposit a single-phase perovskite layer of the composition Pb(Sc$_{0.5}$Ta$_{0.5}$)O$_3$, a solution is prepared again. To deposit a single-phase perovskite layer, this solution is provided on a substrate comprising an intermediate layer of the composition PbZr$_{0.35}$Ti$_{0.65}$O$_3$ in accordance with example 1. This solution is manufactured as follows. A quantity of 10.00 g lead-acetate (63.9 wt. % Pb) was dissolved in 14 ml methoxyethanol. A quantity of 4.548 g scandium-2,4-pentanedionate (12.95 wt. % Sc) and 5.3268 g tantalum-penta-ethoxide (44.5 wt. % Ta) were dissolved in 31 ml methoxyethanol and allowed to react for 3 hours while being subjected to a refluxing process. The solution, which comprises scandium and tantalum, was added to the lead-acetate solution while stirring, reacted for 12 hours while stirring and, subsequently, passed through a Teflon filter having a pore size of 0.2 μm. This solution, which comprises an excess of lead, was provided on a substrate, which was pre-treated in accordance with example 1, and which comprises an approximately 0.1 μm thick intermediate layer of PbZr$_{0.35}$Ti$_{0.65}$O$_3$. To this end, this solution was homogeneously distributed over the pre-treated substrate by spin coating at 2500 r.p.m. This coating was sintered at 850° C. for 1 minute. Dependent upon the desired thickness of the covering layer, this coating process can be repeated. This composite material can also particularly suitably be used for pyro-electric applications.

EXAMPLE 7

To deposit a single-phase perovskite layer comprising a perovskite of the composition Pb$_{0.93}$La$_{0.05}$Zr$_{0.53}$Ti$_{0.47}$O$_3$ on a substrate comprising an intermediate layer of the composition PbZr$_{0.35}$Ti$_{0.65}$O$_3$ in accordance with example 1, a solution of the starting compounds was manufactured in the following manner. A quantity of 10.00 g lead acetate (63.9 wt. % Pb) was dissolved in 35 ml methoxyethanol. A quantity of 6.480 g zirconium-n-propoxide (20.68 wt. % Zr) was dissolved in 7 ml methoxyethanol. A quantity of 3.701 g titanium-tetra-n-butylate (14.1 wt. % Ti) and 0.596 g lanthanum acetate hydrate (32.3 wt. % La) were added to this zirconium-containing solution. This solution, which comprises titanium, zirconium and lanthanum, was admixed with the lead-acetate solution and, subsequently, diluted with methoxyethanol in a ratio of 1:1. This solution, which comprises an excess of lead, was passed through a Teflon filter having a pore size of 0.2 μm. The filtrate was homogeneously distributed over the pretreated substrate by spin coating at 2500 r.p.m. This coating was heated in a diffusion furnace in an oxygen atmosphere to 600° C. at a rate of 370° C./min, and maintained at this temperature for 1 hour, whereafter it was cooled at a rate of 370° C./min. Dependent upon the required thickness of the covering layer, this coating process can be repeated. In the last coating process, the coating is pre-fired at 600° C. for one hour, whereafter it is heated to 650° C. at a rate of 5° C./min and treated at 650° C. for one hour. This composite material can very suitably be used for piezoelectric applications.

What is claimed is:

1. A perovskite-containing composite material comprising a substrate, an intermediate layer of a first titanium-containing perovskite and a covering layer of a second perovskite, characterized in that both the first and the second perovskites are quaternary or more complex perovskites.

2. A perovskite-containing composite material as claimed in claim 1, characterized in that both the first and the second perovskites contain titanium and in that the titanium content of the first perovskite exceeds that of the second perovskite.

3. A perovskite-containing composite material as claimed in claim 2, characterized in that the perovskite of the covering layer contains lead.

4. A perovskite-containing material as claimed in claim 2, characterized in that the perovskite of the intermediate layer contains lead.

5. A perovskite-containing material as claimed in claim 2, characterized in that the perovskite of the intermediate layer contains lead.

6. A perovskite-containing composite material as claimed in claim 2, characterized in that the substrate comprises a silicon-monocrystal layer.

7. A perovskite-containing composite material as claimed in claim 1, characterized in that the perovskite of the covering layer contains lead.

8. A perovskite-containing composite material as claimed in claim 7, characterized in that the perovskite of the covering layer contains lead.

9. A perovskite-containing composite material as claimed in claim 1, characterized in that the perovskite of the intermediate layer contains lead.

10. A perovskite-containing composite material as claimed in claim 1, characterized in that the perovskite of the covering layer is $PbZr_xTi_{1-x}O_3$, wherein $0.53 \leq x < 1$.

11. A perovskite-containing composite material as claimed in claim 1, characterized in that the perovskite of the covering layer is $(Pb_{1-1.5y}La_y)Zr_xTi_{1-x}O_3$, wherein $0.01 \leq y \leq 0.15$ and $0.53 \leq x < 1$ or $Pb(Mg, Nb)_xTi_{1-x}O_3$, wherein $0.65 \leq x \leq 0.9$.

12. A perovskite-containing composite material as claimed in claim 1, characterized in that the perovskite of the intermediate layer is $PbZr_xTi_{1-x}O_3$, wherein $0 < x \leq 0.35$.

13. A perovskite-containing composite material as claimed in claim 1, characterized in that the perovskite of the intermediate layer is $PbZr_{0.35}Ti_{0.65}O_3$.

14. A perovskite-containing composite material as claimed in claim 1, characterized in that the substrate comprises a silicon-monocrystal layer.

15. A method of manufacturing a perovskite-containing composite material as claimed in claim 1, by providing a substrate with a first titanium-containing quaternary or more complex perovskite intermediate layer, and with a second quaternary or more complex perovskite as a covering layer, the coating forming the intermediate layer being sintered before the covering layer is provided.

16. A method as claimed in claim 15, characterized in that the coating is provided by means of a sol-gel process, modified sol-gel process or by metallo-organic decomposition.

17. A method as claimed in claim 15, characterized in that the coatings are provided by spin coating.

18. An electronic component comprising a perovskite-containing composite material as claimed in claim 1.

19. An electronic component as claimed in claim 18, characterized in that it is a capacitor, a ferroelectric non-volatile memory, a dynamic, random-access write-read memory, an actuator, a non-linear resistor, a piezoelectric transducer, a pyroelectric or piezoelectric sensor or an optoelectronic component.

20. A module comprising integrated passive components including an electronic component as claimed in claim 18.

* * * * *